United States Patent
Morley et al.

(10) Patent No.: US 6,867,540 B2
(45) Date of Patent: Mar. 15, 2005

(54) INTERCONNECTING FLAT PANEL DISPLAY ELEMENTS

(75) Inventors: Roland M. Morley, Tempe, AZ (US); Robert C. Sundahl, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 60 days.

(21) Appl. No.: 10/161,012

(22) Filed: May 31, 2002

(65) Prior Publication Data

US 2003/0222574 A1 Dec. 4, 2003

(51) Int. Cl.$^7$ .............................. H01J 1/62; H01J 63/04
(52) U.S. Cl. ........................................ 313/505; 313/498
(58) Field of Search ........................ 313/498, 500–506

(56) References Cited

U.S. PATENT DOCUMENTS

| | | | | |
|---|---|---|---|---|
| 4,445,132 A | * | 4/1984 | Ichikawa et al. ............. 257/72 |
| 4,839,558 A | * | 6/1989 | Mierzwinski ................ 313/510 |
| 5,276,382 A | * | 1/1994 | Stocker et al. .............. 313/506 |
| 5,448,387 A | * | 9/1995 | Kurokawa et al. ............. 359/88 |
| 5,589,732 A | * | 12/1996 | Okibayashi et al. ......... 313/506 |
| 5,652,067 A | * | 7/1997 | Ito et al. ...................... 428/690 |
| 5,708,280 A | * | 1/1998 | Lebby et al. .................. 257/88 |
| 6,091,194 A | * | 7/2000 | Swirbel et al. .............. 313/496 |

OTHER PUBLICATIONS

Ponnusamy Palanisamy, U.S. Appl. No. 09/904,246, filed Jul. 12, 2001, entitled "Interconnecting Large Area Display Panels".

* cited by examiner

Primary Examiner—Joseph Williams
Assistant Examiner—Peter Macchiarolo
(74) Attorney, Agent, or Firm—Trop, Pruner & Hu, P.C.

(57) ABSTRACT

A flat panel display may be formed with transverse row and column electrodes. Contacts may be made through one electrode to another electrode by forming an offset in the first electrode to reach the second electrode. As a result, the fill factor of the resulting display may be improved.

20 Claims, 2 Drawing Sheets

INTERCONNECTING FLAT PANEL DISPLAY ELEMENTS

BACKGROUND

This invention relates generally to flat panel displays.

An example of a flat panel display is an emissive display such as an organic light emitting device display. Other flat panel displays include liquid crystal displays, liquid crystal on silicon displays, plasma displays, and micromirror displays.

Generally, some types of flat panel displays may include row electrodes and transversely arranged column electrodes. A light emitting material or light modulating material may be contained between the row and column electrodes. In one configuration, each pixel consists of tricolor sub-pixels such as red, green, and blue sub-pixels.

Ideally, the pixels of the display should be packed as close together as possible to improve the fill factor of the display. Generally, the more closely packed are the individual sub-pixels and pixels, the higher the perceived brightness of the display.

However, in order to interconnect the various driving components to the various sub-pixels, and to provide the needed potentials to the row and column electrodes, interconnections may be necessary. These interconnections may be arranged in a way which decreases the fill factor of the display. This may be because the display may need to be arranged in a way that the interconnections are arranged between pixels or sub-pixels. The room taken by these interconnections decreases the space available for digits producing pixels.

Of course, the interconnections can also be made around the periphery of the overall display. However, this has many disadvantages, including the fact that the available edge space may be limited in some cases. In addition, the edge regions may be subject to disruption from impact or the use of sealing materials to interface the display with one or more additional displays or other elements. Making electrical connection to rows and columns at the periphery of the display is inefficient, as the electric current needed to activate the pixel must travel through a long, resistive path of electrodes before and after it passes through the (active) pixel.

Thus, there is a need for ways to improve the fill factor of flat panel displays.

DETAILED DESCRIPTION

Figure 1:
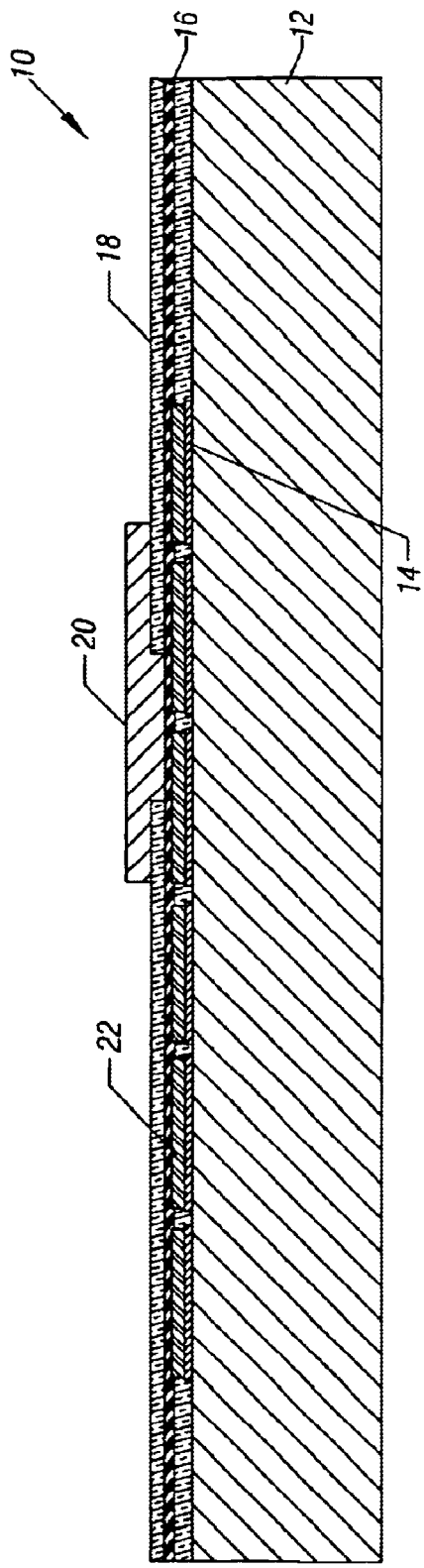
FIG. 1 is an enlarged cross-sectional view of one embodiment of the present invention.

In accordance with one embodiment of the present invention, shown in FIG. 1, a flat panel display 10 may be formed as an organic light emitting diode (OLED), or polymer light emitting diode (PLED); however, the present invention is not limited to OLEDs or PLEDs. An organic light emitting display may include organic light emitting elements 22. Each element 22 may emit a different color of light.

Traditionally, displays include pixels that emit three different colors of light. In some cases, the sub-pixels made up of the different light colors may be spaced from one another. For example, the sub-pixels may produce red, green, and blue light, in one example.

Thus, each of the light emitting elements 22 may be part of a light emitting pixel including sub-pixels that produce light of three different colors. In the simple example shown in FIG. 1, two pixels are illustrated, each pixel including three sub-pixels. Each light emitting element 22 is positioned over a anode or column electrode 14 in one embodiment of the present invention.

The electrodes 14 may be transparent electrodes made of indium tin oxide (ITO), as one example. Light emitted by the elements 22 may shine through the electrodes 14 and through the relatively transparent substrate 12 to be visible by the user.

Between the light emitting elements 22 may be a thin physical barrier of polyimide or similar material (not shown). Generally, the cathode or row electrodes 16 extend transversely to the anode or column electrodes 14, in one embodiment of the present invention. As a result, an active sub-pixel is formed in the light emitting element 22 at the intersection of row 16 and column electrodes 14. As a result of an imposition of a potential across the light emitting element 22, the element 22 may be caused to emit light of a given color.

A passivation material 18 may also overlay the cathode or row electrodes 16.

A contact 20 may be formed on the upper surface of a passivation 18. The upper surface of a passivation 18 is invisible to the user. The contact pad 20 may extend through the passivation 18 to contact the cathode or row electrode 16 in this example. Thus, it may be appreciated that the electrical connection can be made to the row electrode 16 in a fashion which does not alter the density of the light emitting elements 22 or the fill factor of the resulting display 10. In one embodiment, the contact pads 20 may have a circular configuration, however, other configurations may be used in some embodiments of the present invention.

Figure 2:
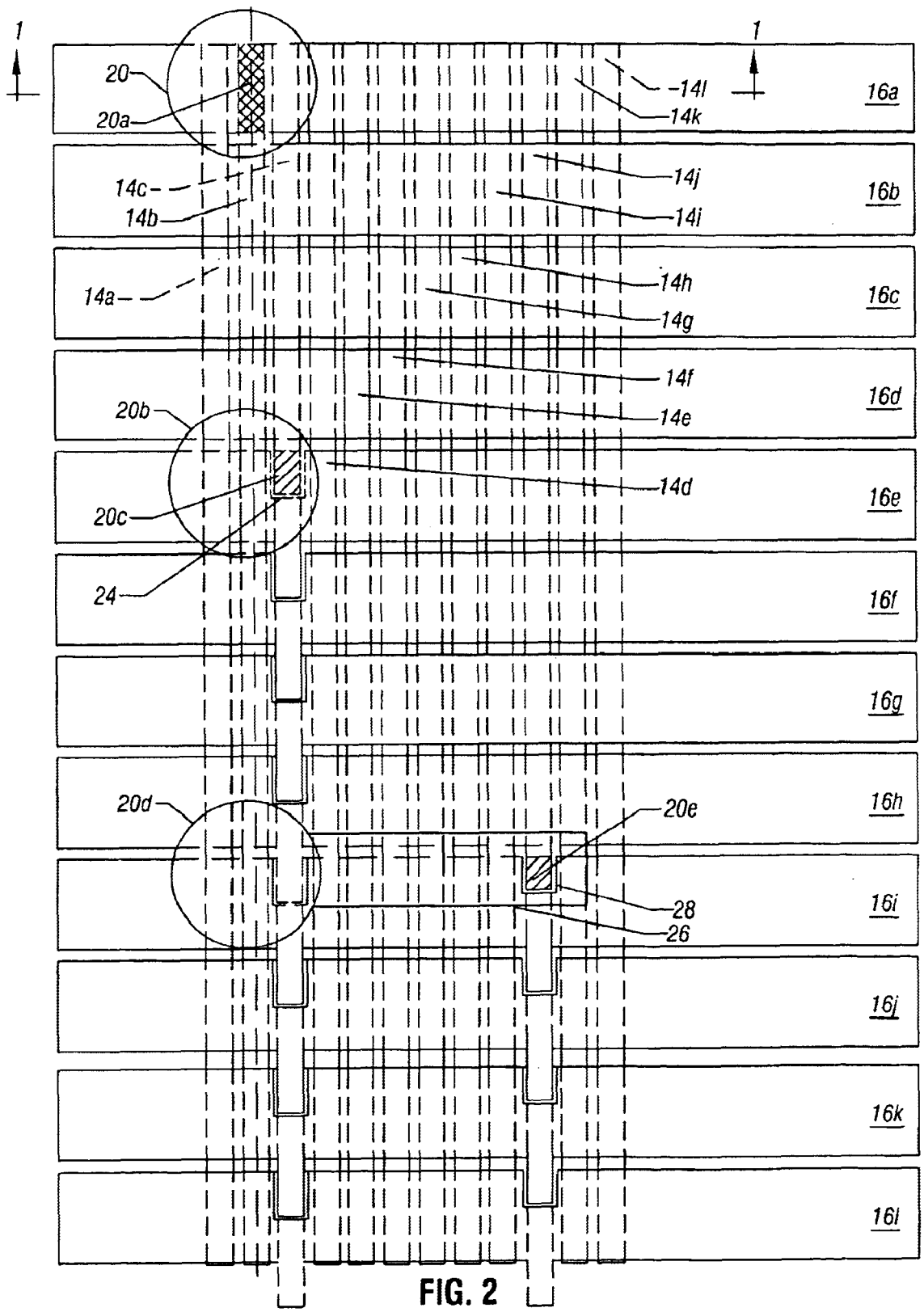
FIG. 2 is a greatly enlarged top plan view of one embodiment of the present invention.

Referring to FIG. 2, the display 10 may include a plurality of row electrodes 16a through 16l. Extending generally transversely to the rows 16 are a plurality of column electrodes 14a through 14l. Each pixel may be formed of a set of three column electrodes, such as the column electrodes 14a through 14c and the column electrodes 14d through 14f, and so on. Thus, a combination of three column electrodes 14 and one row electrode 16 forms a pixel having three sub-pixels. More particularly, each pixel is made up of three intermediate elements 22, each overlying a row electrode 16 and three underlying three adjacent column electrodes 14. It should be understood that each column electrode 14 is actually formed of a plurality of segments, as indicated in FIGS. 1 and 2. Of course, other arrangements are also possible.

As indicated at 20, the contact pad 20 makes contact as indicated at 20a to the row electrode 16a. This is a relatively simple connection because the row contact can be made from the top without in any way affecting the elements 22 or the column electrodes 14.

The contact pad 20b makes contact to the column electrode 14c. It does so at the contact surface 20c. Thus, the contact pad 20b extends downwardly through the passivation layer 18 and through an offset 24 formed in the row electrode 16e. By displacing the sub-pixel to create the via, and because electrical contact may be made to only a few pixels per column (for example, one in 40 to one in 80), in some embodiments very little of available area is used for these contacts, resulting in little impact on the active area.

Contacts may be made to other columns within a certain basic horizontal distance of the vertical contact column by similar means, creating a pattern of small displacements to the sub-pixel layout pattern. There are a variety of patterns that are viable, and all may result in a relative displacement between adjacent sub-pixels along the same row of ⅓ of a sub-pixel. This is within the bounds of being non-discernible to the display viewer.

The contact 20d is an example of a column contact for the column 14j, which is displaced from the contact pad column by a horizontal distance so that it does not fall directly beneath the circular contact pad 20d area. In this case, the contact pad 20d is constructed with a horizontal arm 26 that extends over the row 16i. A via 20e is made through the passivation layer 18 and the cathode row 16i is displaced immediately around the via 20e, as indicated at 28. The displacement 28 allows a contact pad 20d to electrically connect to the column 14j at the contact 20e.

The distribution of contact pads 20 across the back of the display 10 is dependent on a variety of display parameters including size, resolution, and electrical properties, as well as the strip resistance of the row and column materials. As one example, for a display measuring 60 millimeters in height versus 80 millimeters in width with a pixel pitch of 0.25 millimeters, each column of contact pads may contain 60 pads which are for the columns and 16 pads that are for the rows. Using this distribution for each column, the entire display may have five contact points on each column and three contact points on each row. Other embodiments may redistribute the number of contacts made to each row or to each column as desired.

Once the display panel design rules for fabrication are taken into account, a relatively high practical active area may be on the order of 70 percent in some embodiments. This value may be larger for displays with larger pixels and smaller for displays with smaller pixels. The effect on active area ratio by introducing these techniques of electrical connection is generally small and typically may be one percent or less, in some cases.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
   forming a flat panel display including first and second transverse electrodes;
   forming a contact to said second electrode using a via; and
   forming a notch in said first electrode to enable an electrical connection to said second electrode.

2. The method of claim 1 wherein forming a flat panel display includes forming substantially transverse electrodes with a light emitting material between said electrodes.

3. The method of claim 1 including forming a first surface through which display light is emitted and a second surface through which display light is not emitted and positioning said second electrode closer to said first surface.

4. The method of claim 3 wherein forming a contact includes forming a contact directly from said second surface to said second electrode.

5. The method of claim 4 including forming said contact from said second surface to a row electrode.

6. The method of claim 3 including forming the contact from said second surface to said first electrode.

7. The method of claim 6 including forming said contact to said second electrode, bypassing the first electrode.

8. The method of claim 7 including forming a notch in said first electrode to facilitate the passage of said via to said second electrode.

9. The method of claim 3 wherein forming a contact includes forming a contact on said second surface and an offset coupled to said contact and extending across said second surface to contact said second electrode.

10. The method of claim 9 including forming a via from said offset to said second electrode.

11. A flat panel display comprising:
    a non-transparent substrate;
    transverse first and second electrodes formed on said non-transparent substrate;
    a transparent substrate positioned over said electrodes;
    a first contact extending from said non-transparent substrate to said second electrode; and
    said first electrode having a notch to enable said contact to the second electrode.

12. The display of claim 11 wherein said first contact is formed to a row electrode.

13. The display of claim 11 wherein said second electrode is closer to the non-transparent substrate than said first electrode, said first contact contacts said first electrode.

14. The display of claim 11 wherein said second electrode is farther away from said non-transparent substrate than said first electrode and said first contact contacts said second electrode.

15. The display of claim 11 including a second contact having an extension which extends generally parallel to said non-transparent substrate and is coupled to said second electrode.

16. The display of claim 15 including a via formed from said extension to said second electrode.

17. The display of claim 11 wherein said display is an organic light emitting device display.

18. A display comprising:
    a substrate;
    a first electrode formed over said substrate;
    a light emitting material formed over said first electrode;
    a second electrode formed over said light emitting material, said second electrode generally transverse to said first electrode;
    a notch formed in said first electrode; and
    a via extending through said substrate, said first electrode and said notch to electrically contact said second electrode.

19. The display of claim 18 wherein said display is an organic light emitting display.

20. The display of claim 18 wherein said contact includes a first portion on one side of said substrate, a via extending through said substrate, and a second portion contacting said second electrode.

* * * * *